(12) United States Patent  
Sherohman et al.

(10) Patent No.: US 8,338,916 B2
(45) Date of Patent: Dec. 25, 2012

(54) THERMAL OXIDATION OF SINGLE CRYSTAL ALUMINUM ANTIMONIDE AND MATERIALS HAVING THE SAME

(75) Inventors: John William Sherohman, Livermore, CA (US); Jick Hong Yee, Livermore, CA (US); Arthur William Coombs, III, Livermore, CA (US); Kuang Jen J. Wu, Cupertino, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 30 days.

(21) Appl. No.: 12/976,994

(22) Filed: Dec. 22, 2010

(65) Prior Publication Data

US 2012/0161288 A1 Jun. 28, 2012

(51) Int. Cl.
*H01L 29/20* (2006.01)
(52) U.S. Cl. .................. 257/615; 257/E29.089
(58) Field of Classification Search .......... 257/615, 257/E29.089
See application file for complete search history.

(56) References Cited

U.S. PATENT DOCUMENTS

| | | | |
|---|---|---|---|
| 6,887,441 | B2 | 5/2005 | Sherohman et al. |
| 7,224,041 | B1 | 5/2007 | Sherohman et al. |
| 7,309,393 | B2 | 12/2007 | Sherohman et al. |
| 2005/0098096 | A1 | 5/2005 | Sherohman et al. |
| 2007/0137700 | A1 | 6/2007 | Sherohman et al. |
| 2008/0073641 | A1* | 3/2008 | Cheng et al. .......... 257/25 |

OTHER PUBLICATIONS

Shibata et al., "A Rutherford Backscattering Spectroscopic Study of the Aluminum Antimonide Oxidation Process In Air,"Japan Journal of Applied Physics, vol. 33, Part 1, No. 4A, Apr. 1994, pp. 1767-1772.

Nakata et al., "Suppression of AlSb Oxidation With Hydrocarbon Passivation Layer Induced By MeV-He+ Irradiation," Journal of Applied Physics, vol. 76, No. 4, Aug. 15, 1994, pp. 2078-2085.
Blum et al., "Wet Thermal Oxidation of AlAsSb Lattice Matched to InP for Optoelectronic Applications," Journal of Applied Physics Letter, vol. 68, No. 22, May 27, 1996, pp. 3129-3131.
Legay et al., "Wet Thermal Oxidation of AlAsSb Alloys Lattice Matched to InP," Journal of Applied Physics, vol. 81, No. 11, France, Jun. 1, 1997, pp. 7600-7603.
Salesse et al., "Wet Oxidation of AlAsSb Alloys Catalyzed by Methanol," 2002 Elsevier Science B.V., Applied Surface Science, vol. 161, pp. 426-433.
Yee et al., "AlSb as a High-Energy Photon Detector," IEEE Transactions on Nuclear Science, vol. 24, No. 4, Nov. 8, 1976, pp. 1962-1967.
U.S. Appl. No. 12/774,388, filed May 5, 2010.

* cited by examiner

*Primary Examiner* — Cuong Q Nguyen
(74) *Attorney, Agent, or Firm* — Dominic M. Kotab

(57) ABSTRACT

In one embodiment, a method for forming a non-conductive crystalline oxide layer on an AlSb crystal includes heat treating an AlSb crystal in a partial vacuum atmosphere at a temperature conducive for air adsorbed molecules to desorb, surface molecule groups to decompose, and elemental Sb to evaporate from a surface of the AlSb crystal and exposing the AlSb crystal to an atmosphere comprising oxygen to form a crystalline oxide layer on the surface of the AlSb crystal. In another embodiment, a method for forming a non-conductive crystalline oxide layer on an AlSb crystal includes heat treating an AlSb crystal in a non-oxidizing atmosphere at a temperature conducive for decomposition of an amorphous oxidized surface layer and evaporation of elemental Sb from the AlSb crystal surface and forming stable oxides of Al and Sb from residual surface oxygen to form a crystalline oxide layer on the surface of the AlSb crystal.

28 Claims, 2 Drawing Sheets

THERMAL OXIDATION OF SINGLE CRYSTAL ALUMINUM ANTIMONIDE AND MATERIALS HAVING THE SAME

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to aluminum antimonide, and more particularly, to the synthesis and use of single crystal aluminum antimonide.

BACKGROUND

A fundamental issue in the fabrication of semiconductor devices using elements from groups III and V is the development of surface passivation techniques on exposed surfaces to overcome leakage current due to surface formation of metastable intermediate compounds upon exposure to air. Consequently, researchers have for many years explored passivation techniques to develop quality III-V semiconductor surfaces for device processing. Such passivation techniques include thermal oxidation, wet oxidation, ion-beam irradiation, plasma oxidation, chemical anodization, and nitridation. In the case of aluminum antimonide (AlSb), this is of particular importance because the AlSb crystal surface is readily oxidized and amorphized through simple exposure to air.

The oxidation process of AlSb in air is typically a two-step process: an initial fast step and a subsequent slower step. The term "oxidation" is used to represent oxidation (e.g., $Al_2O_3$, $Sb_2O_3$, $Sb_2O_4$, and $Sb_2O_5$), hydroxidation (e.g., $Al(OH)_3$), and hydration (e.g., $Al_2O_3./H_2O$, $Sb_2O_3.mH_2O$, $Sb_2O_5.nH_2O$). The first step is a rapid formation of an oxidized amorphous layer, possibly about 150 Å thick. The second step is oxidation that proceeds continuously throughout the AlSb material. The continuous oxidation of AlSb is probably due to hydrolyzation rather than oxidation, i.e., the oxidation agents are mainly $H_2O$ molecules instead of $O_2$ molecules in the atmosphere.

The formation of an amorphous oxide layer on AlSb is not a quality native oxide suitable for device fabrication. Dry and wet techniques to form quality oxide surfaces have not been attempted on single crystal AlSb. However, research efforts have examined the development of native oxides on very thin AlAsSb samples grown by molecular beam epitaxy (MBE) using the technique of wet thermal oxidation. The process is conducted in a tube furnace held at about 300° C. to about 400° C. for several hours by bubbling $N_2$ gas through water heated at about 85° C. Characterization measurements indicated the conversion of Al and Sb into an oxide also generates an elemental Sb layer trapped between the crystal-oxide interfaces. The presence of elemental Sb between the crystal-oxide interfaces, however, is detrimental in producing a quality native oxide for surface passivation, insulating, and masking processes required for semiconductor device fabrication. It is of technological importance to develop a non-conductive oxide surface for the AlSb semiconducting compound to address significant device applications such as ambient temperature gamma-ray detection and substrate utilization for the 6.1 Å family Antimonide/Arsenide heterostructures devices.

SUMMARY

In one embodiment, a method for forming a non-conductive crystalline oxide layer on an aluminum antimonide (AlSb) crystal includes heat treating an AlSb crystal in a partial vacuum atmosphere at a temperature conducive for air adsorbed molecules to desorb, surface molecule groups to decompose, and elemental Sb to evaporate from a surface of the AlSb crystal and exposing the AlSb crystal to an atmosphere comprising oxygen to form a crystalline oxide layer on the surface of the AlSb crystal.

In another embodiment, a method for forming a non-conductive crystalline oxide layer on an AlSb crystal includes heat treating an AlSb crystal in a non-oxidizing atmosphere at a temperature conducive for decomposition of an amorphous oxidized surface layer and evaporation of elemental Sb from a surface of the AlSb crystal and forming stable oxides of Al and Sb from residual surface oxygen to form a crystalline oxide layer on the surface of the AlSb crystal.

In yet another embodiment, a semiconductor compound includes a crystal comprising AlSb and a non-conductive crystalline layer on the AlSb crystal.

According to another embodiment, a semiconductor compound includes a crystal having an AlSb interior portion and a non-conductive crystalline layer defined by an extent of oxidation into the interior portion.

Other aspects and embodiments of the present invention will become apparent from the following detailed description, which, when taken in conjunction with the drawings, illustrate by way of example the principles of the invention.

DETAILED DESCRIPTION

Figure 1:
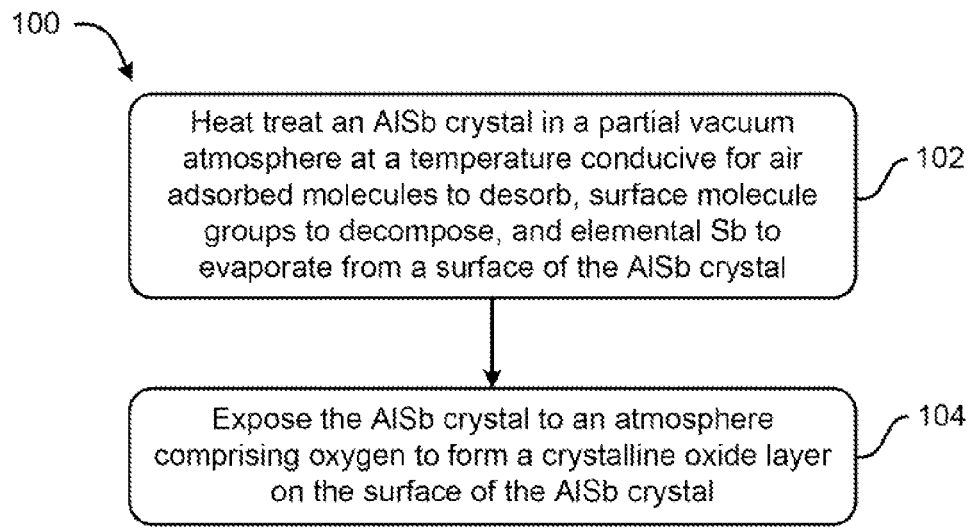
FIG. 1 shows a flowchart of a method, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a method for forming a non-conductive crystalline oxide layer on an aluminum antimonide (AlSb) crystal includes heat treating an AlSb crystal in a partial vacuum atmosphere at a temperature conducive for air adsorbed molecules to desorb, surface molecule groups to decompose, and elemental Sb to evaporate from a surface of the AlSb crystal and exposing the AlSb crystal to an atmosphere comprising oxygen to form a crystalline oxide layer on the surface of the AlSb crystal.

In another general embodiment, a method for forming a non-conductive crystalline oxide layer on an AlSb crystal includes heat treating an AlSb crystal in a non-oxidizing atmosphere at a temperature conducive for decomposition of an amorphous oxidized surface layer and evaporation of elemental Sb from a surface of the AlSb crystal and forming stable oxides of Al and Sb from residual surface oxygen to form a crystalline oxide layer on the surface of the AlSb crystal.

In yet another general embodiment, a semiconductor compound includes a crystal comprising AlSb and a non-conductive crystalline layer on the AlSb crystal.

According to another general embodiment, a semiconductor compound includes a crystal having an AlSb interior portion and a non-conductive crystalline layer defined by an extent of oxidation into the interior portion.

According to one embodiment, a thermal process to develop a crystalline oxide layer, which is predominantly an oxide of aluminum (Al), on single crystal AlSb is presented. Crystals of AlSb are heat treated in a partial vacuum atmosphere or in a partial oxygen atmosphere at a temperature conducive for air adsorbed molecules to desorb, surface molecule groups to decompose, and elemental Sb to evaporate from a surface of the AlSb crystal. In each case, the surface of the AlSb crystal becomes Al-rich by the Sb evaporation and the removal of hydrolyzation molecules, which produces a surface crystalline oxide layer that is non-conductive from either residual oxygen from decomposition of an adsorbed amorphous oxide layer or from the partial oxygen atmosphere. The presence of an amorphous oxide layer on the surface of the AlSb produced from (e.g., room temperature) air oxidation and/or from surface polishing is thereby converted to a very thin (e.g., on the order of several nm) crystalline oxide layer by this process, in several embodiments.

In one preferred embodiment, as shown in FIG. 1, a method 100 for forming a non-conductive crystalline oxide layer on an AlSb crystal is disclosed. The method 100 may be carried out in any desired environment, and may include steps or operations not described herein. Additionally, the operations described below may be modified and/or implemented in a manner different than those described herein, as would be known to one of ordinary skill in the art.

In operation 102, an AlSb crystal is heat treated in a partial vacuum atmosphere at a temperature conducive for Sb evaporation from a surface of the AlSb crystal. In some embodiments, the AlSb crystal may have a volume of at least about 1 $cm^3$. This size of crystal ensures that it may be used in a broad range of applications after formation of the crystalline layer thereon, such as using the crystal as a semiconductor, as an alpha-particle detector, as a radiation detector, etc. Of course, the crystals produced through method 100 may be larger or smaller, and a volume of 1 $cm^3$ is an illustrative value only.

Temperatures which are conducive to decomposition of air adsorbed hydroxidation and hydration molecules and evaporation of Sb from a surface of the AlSb crystal range from about 350° C. (which is about the temperature for decomposition of Al and Sb hydroxidation and hydration molecules and where Sb begins to evaporate from the AlSb crystal) to about 650° C. (which is about the temperature where $Sb_2O_5$ decomposes to the stable oxide $Sb_2O_3$).

According to one embodiment, the partial vacuum atmosphere comprises no $O_2$. In a further embodiment, the partial vacuum atmosphere also or alternatively comprises no $N_2$. The partial vacuum atmosphere may have a partial vacuum pressure in a range from about 0.01 atm to about 0.99 atm, about 0.1 atm to about 0.9 atm, about 0.3 atm to about 0.7 atm, etc., in several embodiments.

In operation 104, the AlSb crystal is exposed to an atmosphere comprising oxygen to form a crystalline oxide layer on the surface of the AlSb crystal. What is meant by an atmosphere comprising oxygen is that the atmosphere includes $O_2$ or some other oxidant known in the art, and is conducive to oxide formation at a surface of the crystal. For example, in one approach, the atmosphere may contain only $O_2$ and no other gases, particularly $N_2$. In another approach, the atmosphere may include one or more inert gases, such as Ar, Ne, etc., and some amount of $O_2$ or oxidant, wherein the amount of $O_2$ or oxidant present may impact the speed and thickness of the crystalline oxide layer formation. In another approach, the atmosphere may include $O_2$ or oxidant and one or more gases nonreactive with AlSb, Al, and Sb. Other approaches of exposing the crystal to oxygen are also possible, as would be known to one of skill in the art.

In one embodiment, the AlSb crystal may be exposed to the atmosphere comprising oxygen for a period of between about 5 minutes and about 10 minutes. Of course, the length of time of exposure to the atmosphere may impact the thickness of the crystalline oxide layer, in some approaches. Other factors may also impact the thickness, such as partial vacuum pressure, temperature, etc. Any and/or all of the known factors which may impact the thickness of the crystalline oxide layer may be controlled and/or accounted for when forming the crystalline oxide layer to more effectively control the thickness of the crystalline oxide layer, in many approaches.

In another embodiment, the crystalline oxide layer may have a thickness of less than about 10 nm in a direction perpendicular to a plane of formation of the crystalline oxide layer. This thickness range limits the effect that the crystalline oxide layer has on the performance of the crystal/crystalline oxide layer composite in future applications, such as semiconductor applications.

According to one approach, the crystalline oxide layer may comprise predominantly $Al_2O_3$ at a surface thereof. X-ray photoelectron spectroscopy (XPS) showed surface oxide composition to be $Al_2O_3$ and $Sb_2O_3$ with no presence of elemental Sb. By predominantly, what is indicated is that the surface of the crystalline oxide layer may have at least 99% $Al_2O_3$, at least 90% $Al_2O_3$, at least 80% $Al_2O_3$, at least 51% $Al_2O_3$, etc. Of course, oxide formation is not always guaranteed, even under extremely stringent conditions; therefore, it is intended that the surface of the crystalline oxide layer should include as much $Al_2O_3$ as possible under the formation techniques presented herein. As the percentage of $Al_2O_3$ at the surface of the crystalline oxide layer decreases, the oxidation barrier protection which this layer provides to the AlSb crystal also decreases.

According to one embodiment, to expedite the formation of the crystalline oxide layer, the AlSb crystal may be exposed to the atmosphere comprising oxygen while under partial vacuum pressure, as described earlier. In an alternate embodiment, the AlSb crystal may be exposed to the atmosphere comprising oxygen while under ambient pressure, e.g., about 1 atm.

Figure 2:
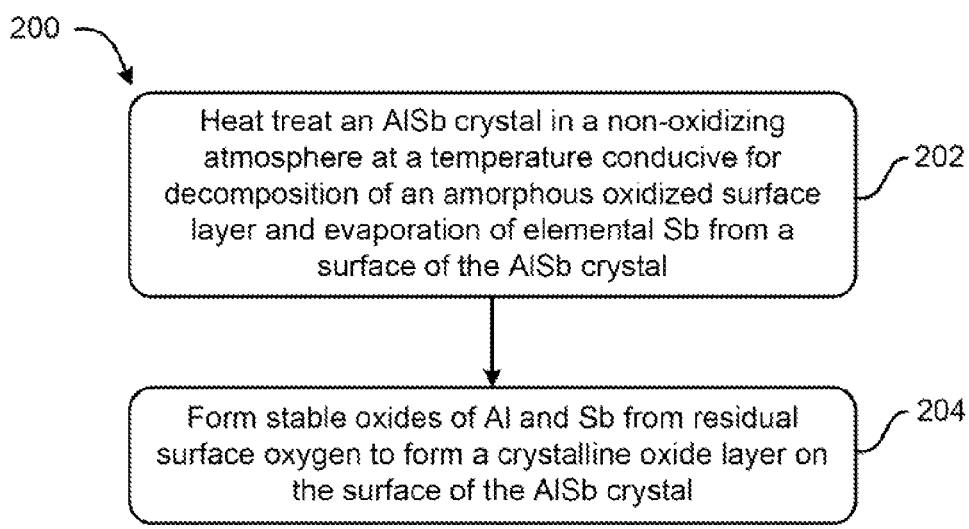
FIG. 2 shows a flowchart of a method, in accordance with one embodiment.

In one preferred embodiment, as shown in FIG. 2, a method 200 for forming a non-conductive crystalline oxide layer on an AlSb crystal using a non-oxidizing gas, such as argon and/or nitrogen, is disclosed. The method 200 may be carried out in any desired environment, and may include steps or operations not described herein. Additionally, the operations described below may be modified and/or implemented in a manner different than those described herein, as would be known to one of ordinary skill in the art.

In operation 202, an AlSb crystal is heat treated in an atmosphere of a non-oxidizing gas at a temperature conducive for decomposition of Al and Sb hydroxidation and hydration molecules and Sb evaporation from a surface of the AlSb crystal. The non-oxidizing gas may be nitrogen, argon, neon, etc., in various embodiments. As a result of the heat treating, a non-conductive crystalline oxide layer may be formed directly from the residue oxygen from decomposition of the Al and Sb hydroxidation and hydration molecules, in one embodiment. In more embodiments, the AlSb crystal may have a volume of at least about 1 cm$^3$. This size of crystal ensures that it may be used in a broad range of applications after formation of the crystalline layer thereon, such as using the crystal as a semiconductor, as an alpha-particle detector, as a radiation detector, etc. Of course, the crystals produced through method 200 may be larger or smaller, and a volume of 1 cm$^3$ is an illustrative value only.

When nitrogen is used, a heat treatment temperature may be a temperature that is below the temperature at which AlN forms, in preferred embodiments.

Temperatures which are conducive to decomposition of air adsorbed hydroxidation and hydration molecules and evaporation of Sb from a surface of the AlSb crystal range from about 350° C. (which is about the temperature for decomposition of Al and Sb hydroxidation and hydration molecules and where Sb begins to evaporate from the AlSb crystal) to about 650° C. (which is about the temperature where $Sb_2O_5$ decomposes to the stable oxide $Sb_2O_3$). This range of temperature is below that required for AlN formation (liquid Al reacts with nitrogen gas to form AlN solid at a temperature of about 830° C.). X-ray photoelectron spectroscopy (XPS) showed surface oxide composition to be $Al_2O_3$ and $Sb_2O_3$ with no presence of elemental Sb or AlN.

In operation 204, stable oxides of Al and Sb are formed from residual surface oxygen to form a crystalline oxide layer on the surface of the AlSb crystal.

In one embodiment, the AlSb crystal may be exposed to the non-oxidizing atmosphere for a period of between about 5 minutes and about 10 minutes. Of course, the length of time of exposure to the atmosphere may impact the thickness of the resulting crystalline oxide layer, in some approaches. Other factors may also impact the thickness, such as partial vacuum pressure, temperature, etc. Any and/or all of the known factors which may impact the thickness of the crystalline oxide layer may be controlled and/or accounted for when forming the crystalline oxide layer to more effectively control the thickness of the crystalline oxide layer, in many approaches.

In another embodiment, the crystalline oxide layer may have a thickness of less than about 10 nm in a direction perpendicular to a plane of formation of the crystalline oxide layer.

According to one approach, the crystalline oxide layer may comprise predominantly $Al_2O_3$ at a surface thereof. By predominantly, what is indicated is that the surface of the crystalline oxide layer may have at least 99% $Al_2O_3$, at least 90% $Al_2O_3$, at least 80% $Al_2O_3$, at least 51% $Al_2O_3$, etc. Of course, oxide formation is not always guaranteed, even under extremely stringent conditions; therefore, it is intended that the surface of the crystalline oxide layer should include as much as Al2O3 as possible under the formation techniques presented herein. As the percentage of $Al_2O_3$ at the surface of the crystalline oxide layer decreases, the oxidation barrier protection which this layer provides to the AlSb crystal also decreases.

According to one embodiment, to expedite the formation of the crystalline oxide layer, the AlSb crystal may be exposed to the non-oxidizing atmosphere, such as one comprising nitrogen, argon, neon, etc., while under partial vacuum pressure, as described earlier. In an alternate embodiment, the AlSb crystal may be exposed to the non-oxidizing atmosphere while under ambient pressure, e.g., about 1 atm.

Figure 3:
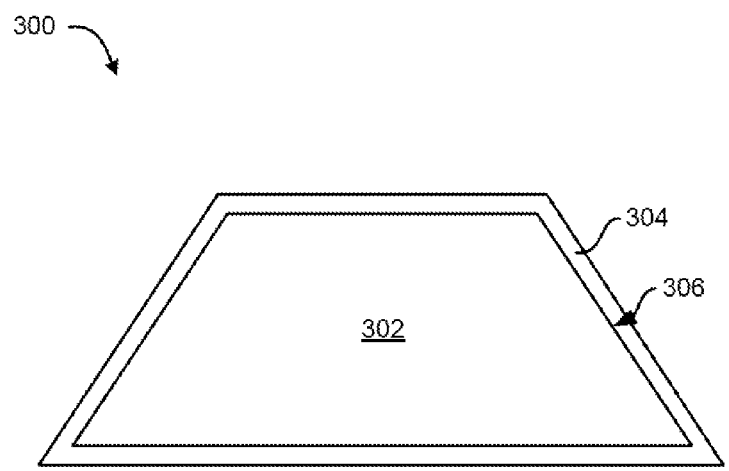
FIG. 3 shows a semiconductor compound, according to one embodiment.

Now referring to FIG. 3, according to another preferred embodiment, a semiconductor compound 300 includes a crystal 302 comprising AlSb and a non-conductive crystalline layer 304 on the AlSb crystal. By "on the AlSb crystal," in one embodiment, what is meant is that the non-conductive crystalline layer 304 exhibits characteristics of having been formed from the crystal 302, e.g., by oxidation of the crystal. Thus, the interface 306 between the non-conductive crystalline layer 304 and the crystal 302 may have characteristics of an oxidation front created during formation of the non-conductive crystalline layer 304. In another embodiment, "on the AlSb crystal" indicates that the non-conductive crystalline layer 304 exists at a surface of the crystal 302, with no intervening layers between the crystal 302 and the non-conductive crystalline layer 304.

In some embodiments, the AlSb crystal may have a volume of at least about 1 cm$^3$. This size of crystal ensures that it may be used in a broad range of applications after formation of the crystalline layer thereon, such as using the crystal as a semiconductor, as an alpha-particle detector, as a radiation detector, etc. Of course, the crystal 302 may be larger or smaller, and a volume of 1 cm$^3$ is an illustrative value only.

In another embodiment, the crystalline layer may have a thickness of less than about 10 nm in a direction perpendicular to a plane of formation of the crystalline layer, for reasons indicated earlier.

In one approach, the crystalline layer may be a crystalline oxide layer comprising predominantly $Al_2O_3$ at a surface thereof, for reasons described above.

In one embodiment, an interface between the crystal and the crystalline layer may be physically characterized by an extent of oxidation of a portion of the crystal from an outer surface thereof inward. This may be caused by formation of the crystalline layer according to one of method 100 and/or method 200, as described above.

In another embodiment, the crystalline layer may be characterized by a substantial or complete absence of antimony (Sb) therein, particularly at an outer surface thereof. This may be caused by heat treatment of the AlSb crystal, as described in methods 100 and 200, above.

In more embodiments, an oxidation front that is characteristic of oxidation of an outer portion of the crystal may separate the crystalline layer from the crystal. According to one approach, as described in methods 100 and/or 200, as the outer layers of the crystal become oxidized in their respective atmospheres, an interface (oxidation front) may develop between the portion of the crystal which has already become oxidized (the crystalline layer) and the remaining portion of the crystal. This interface may impart certain characteristics onto the compound.

In one approach, a ratio of Al to Sb in the crystalline layer may be higher than a ratio of Al to Sb in the crystal. This may be due in part to evaporation of the Sb from the outer surfaces of the crystal prior to oxidation or nitridation, as described in methods 100 and/or 200.

A semiconductor compound, according to another embodiment, includes a crystal having an aluminum antimonide (AlSb) interior portion and a non-conductive crystalline layer defined by an extent of oxidation or nitridation into the interior portion. In some embodiments, a ratio of Al to Sb in the crystalline layer may be higher than a ratio of Al to Sb in the interior portion.

The development of a non-conductive oxide surface for an AlSb semiconductor compound enables its application as an alpha-particle detector, radiation detector, and, of particular importance, as a substrate for revolutionary new low-noise, low-power, high-speed electronic antimonide/arsenide heterostructure devices, among many other uses and applications.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A semiconductor compound, comprising:
   a crystal comprising aluminum antimonide (AlSb); and
   a non-conductive crystalline layer on the AlSb crystal.

2. The semiconductor compound of claim 1, wherein the AlSb crystal has a volume of at least about 1 cm$^3$.

3. The semiconductor compound of claim 1, wherein the crystalline layer has a thickness of less than about 10 nm in a direction perpendicular to a plane of formation of the crystalline layer.

4. The semiconductor compound of claim 1, wherein the crystalline layer is a crystalline oxide layer comprising predominantly $Al_2O_3$ at a surface thereof.

5. The semiconductor compound of claim 1, wherein an interface between the crystal and the crystalline layer is physically characterized by an extent of oxidation of a portion of the crystal from an outer surface thereof inward.

6. The semiconductor compound of claim 1, wherein an oxidation front that is characteristic of oxidation of an outer portion of the crystal separates the non-conductive crystalline layer from the AlSb crystal.

7. The semiconductor compound of claim 1, wherein a ratio of Al to Sb in the non-conductive crystalline layer is higher than a ratio of Al to Sb in the AlSb crystal.

8. A semiconductor compound, comprising:
   a crystal having an aluminum antimonide (AlSb) interior portion and a non-conductive crystalline layer defined by an extent of oxidation into the interior portion,
   wherein an oxidation front that is characteristic of oxidation of an outer portion of the crystal separates the non-conductive crystalline layer from the AlSb crystal.

9. The semiconductor compound of claim 8, wherein a ratio of Al to Sb in the crystalline layer is higher than a ratio of Al to Sb in the interior portion.

10. A method for forming the semiconductor compound of claim 1, the method comprising:
    heat treating an AlSb crystal in a partial vacuum atmosphere at a temperature conducive for air adsorbed molecules to desorb, surface molecule groups to decompose, and elemental Sb to evaporate from a surface of the AlSb crystal; and
    exposing the AlSb crystal to an atmosphere comprising oxygen to form a crystalline oxide layer on the surface of the AlSb crystal.

11. The method of claim 10, wherein the heat treating temperature is from about 350° C. to about 650° C.

12. The method of claim 10, wherein the partial vacuum atmosphere comprises no oxygen.

13. The method of claim 10, wherein the AlSb crystal is exposed to the atmosphere comprising oxygen for a period of between about 5 minutes and about 10 minutes.

14. The method of claim 10, wherein the AlSb crystal has a volume of at least about 1 cm$^3$.

15. The method of claim 10, wherein the crystalline oxide layer has a thickness of less than about 10 nm in a direction perpendicular to a plane of formation of the crystalline oxide layer.

16. The method of claim 10, wherein the crystalline oxide layer comprises predominantly $Al_2O_3$ at a surface thereof.

17. The method of claim 10, wherein the AlSb crystal is exposed to the atmosphere comprising oxygen while under partial vacuum pressure.

18. The method of claim 10, wherein the AlSb crystal is exposed to the atmosphere comprising oxygen while under ambient pressure.

19. The method of claim 10, wherein the AlSb crystal is exposed to the atmosphere comprising oxygen while being heat treated.

20. A method for forming the semiconductor compound of claim 1, the method comprising:
    heat treating an AlSb crystal in a non-oxidizing atmosphere at a temperature conducive for decomposition of an amorphous oxidized surface layer and evaporation of elemental Sb from a surface of the AlSb crystal; and
    forming stable oxides of Al and Sb from residual surface oxygen to form a crystalline oxide layer on the surface of the AlSb crystal.

21. The method of claim 20, wherein the heat treating temperature is from about 350° C. to about 650° C.

22. The method of claim 20, wherein the non-oxidizing atmosphere comprises at least one of: nitrogen, argon, and neon.

23. The method of claim 20, wherein the AlSb crystal is exposed to the non-oxidizing atmosphere for a period of between about 5 minutes and about 10 minutes.

24. The method of claim 20, wherein the AlSb crystal has a volume of at least about 1 cm$^3$.

25. The method of claim 20, wherein the crystalline oxide layer has a thickness of less than about 10 nm in a direction perpendicular to a plane of fomation of the crystalline oxide layer.

26. The method of claim 20, wherein the crystalline oxide layer comprises predominantly $Al_2O_3$ at a surface thereof.

27. The method of claim 20, wherein the AlSb crystal is exposed to the non-oxidizing atmosphere while under partial vacuum pressure.

28. The method of claim 20, wherein the AlSb crystal is exposed to the non-oxidizing atmosphere while under ambient pressure.

* * * * *